(12) United States Patent
Himi et al.

(10) Patent No.: US 7,838,909 B2
(45) Date of Patent: Nov. 23, 2010

(54) SEMICONDUCTOR DEVICE WITH TRENCH STRUCTURE

(75) Inventors: Hiroaki Himi, Nagoya (JP); Takashi Nakano, Nukata-gun (JP); Shoji Mizuno, Okazaki (JP)

(73) Assignee: Denso Corporation, Kariya (JP)

( * ) Notice: Subject to any disclaimer, the term of this patent is extended or adjusted under 35 U.S.C. 154(b) by 749 days.

(21) Appl. No.: 11/528,612

(22) Filed: Sep. 28, 2006

(65) Prior Publication Data

US 2007/0018275 A1 Jan. 25, 2007

Related U.S. Application Data

(62) Division of application No. 10/656,326, filed on Sep. 8, 2003, now Pat. No. 7,132,347.

(30) Foreign Application Priority Data

Sep. 9, 2002 (JP) .............................. 2002-263028

(51) Int. Cl.
*H01L 27/10* (2006.01)
*H01L 27/12* (2006.01)
*H01L 31/0392* (2006.01)

(52) U.S. Cl. .................. 257/205; 257/347; 257/517

(58) Field of Classification Search ......... 257/506–510, 257/E29.02, 328–366, 201–205, 347, E27.112, 257/E29.147
See application file for complete search history.

(56) References Cited

U.S. PATENT DOCUMENTS

| 5,306,940 | A |  | 4/1994 | Yamazaki |
| 5,789,769 | A |  | 8/1998 | Yamazaki |
| 5,966,598 | A |  | 10/1999 | Yamazaki |
| 5,994,200 | A |  | 11/1999 | Kim |
| 6,104,054 | A | * | 8/2000 | Corsi et al. ............ 257/306 |
| 6,130,458 | A | * | 10/2000 | Takagi et al. ........... 257/351 |
| 6,472,254 | B2 |  | 10/2002 | Cantarini et al. |
| 6,653,702 | B2 |  | 11/2003 | Ishio et al. |
| 6,791,156 | B2 |  | 9/2004 | Itou |
| 2001/0032990 | A1 |  | 10/2001 | Koyama et al. |

FOREIGN PATENT DOCUMENTS

| JP | A-51-149776 | 12/1976 |
| JP | A-05-243502 | 9/1993 |
| JP | A-06-151450 | 5/1994 |
| JP | A-08-115974 | 5/1996 |

(Continued)

OTHER PUBLICATIONS

Office Action dated Feb. 15, 2008 in corresponding Japanese Patent Application No. 2002-263028 (and English translation).

(Continued)

*Primary Examiner*—Cuong Q Nguyen
(74) *Attorney, Agent, or Firm*—Posz Law Group, PLC

(57) ABSTRACT

A semiconductor device includes a common diffusion structure formed in each region of a substrate in which semiconductor components are formed. The diffusion structures are separated into sections by trenches to form semiconductor components. The trenches define sizes of the semiconductor components and isolate the semiconductor components from the surrounding area.

20 Claims, 9 Drawing Sheets

FOREIGN PATENT DOCUMENTS

| | | |
|---|---|---|
| JP | A-11-274312 | 10/1999 |
| JP | A-11-274501 | 10/1999 |
| JP | A-2001-015589 | 1/2001 |
| JP | A-2001-257212 | 9/2001 |
| JP | A-2002-009084 | 1/2002 |
| JP | A-2002-141408 | 5/2002 |

OTHER PUBLICATIONS

Office Action dated Jul. 1, 2008 in corresponding Japanese Patent Application No. 2002-263028 (and English translation).

Office Action dated Oct. 2, 2007 in corresponding Japanese patent application No. 2002-263028 (and English translation).

* cited by examiner

SEMICONDUCTOR DEVICE WITH TRENCH STRUCTURE

CROSS REFERENCE TO RELATED APPLICATION

This application is a division of application Ser. No. 10/656,326 filed on Sep. 8, 2003 now U.S. Pat No. 7,132,347. This application is also based on and incorporates by reference Japanese Patent Application No. 2002-263028 filed on Sep. 9, 2002.

FIELD OF THE INVENTION

The present invention relates to a semiconductor device including semiconductor components formed on a semiconductor substrate and separated by trenches, and a method for manufacturing the semiconductor device.

BACKGROUND OF THE INVENTION

It is proposed that different types of semiconductor components are integrated into a single chip to reduce size of a semiconductor device while increasing its functions. This kind of IC is called a hybrid IC. The different types of semiconductor components may be a complementary metal-oxide semiconductor (CMOS) transistor, a bipolar transistor, and a laterally diffused metal oxide semiconductors (LDMOS) transistor. The CMOS, bipolar, and LDMOS transistors are digital, analog, and power components, respectively.

In the hybrid IC, a trench isolation structure is applied for providing isolation by trenches among the components to reduce malfunctions due to electric interference. A silicon on insulator (SOI) substrate is used in the hybrid IC and the trenches are formed in the SOI substrate.

During the manufacturing process of the hybrid IC, the area of the SOI substrate is divided into regions by the trenches. Then, CMOS, bipolar, LDMOS transistors are formed in respective regions. The electric interference among semiconductor components can be reduced by using the SOI substrate and the trench isolation structure.

However, the hybrid IC requires a long testing period because it has various types of semiconductor components integrated in a single chip. Manufacturing processes of the semiconductor components, which are different from each other, become more and more complex due to an increase in variety of the semiconductor components. As a result, the testing period of the hybrid IC becomes even longer, and therefore the development period of the hybrid IC becomes longer, increasing the development cost.

SUMMARY OF THE INVENTION

The present invention therefore has an objective to provide a semiconductor device that does not require a long testing period and high development cost even though it includes a variety of semiconductor components.

The present invention has another objective to provide a method for manufacturing the semiconductor device.

A semiconductor device of the present invention has a semiconductor substrate, a diffusion structure, a trench, and a semiconductor component. The diffusion structure is formed in a region in which the semiconductor component is formed on the semiconductor substrate in size larger than the semiconductor component. The trench is formed in the diffusion structure. The semiconductor component is separated and isolated from its surrounding areas in the substrate by the trench that defines the size of the semiconductor component.

With this configuration, the semiconductor component can be easily formed in different sizes. Therefore, the testing period of the semiconductor device can be shortened and the development cost can be reduced.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1A:
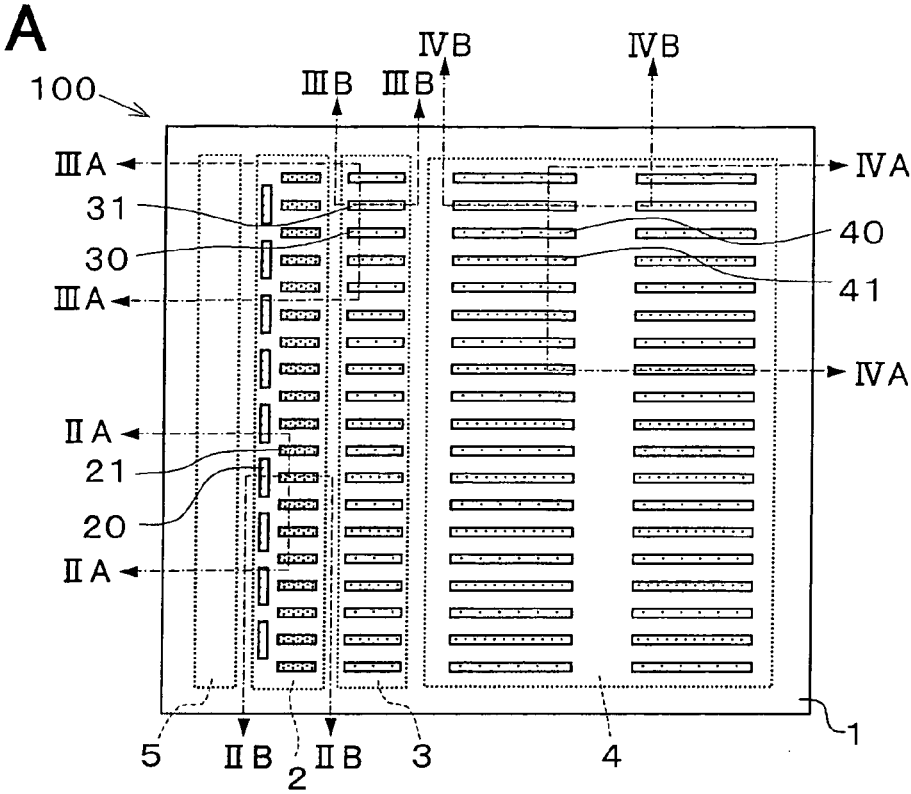
FIG. 1A is a plan view of a semiconductor device according to the first embodiment of the present invention.

The preferred embodiments of the present invention will be explained with reference to the accompanying drawings. In the drawings, the same numerals are used for the same components and devices.

FIRST EMBODIMENT

Figure 1B:
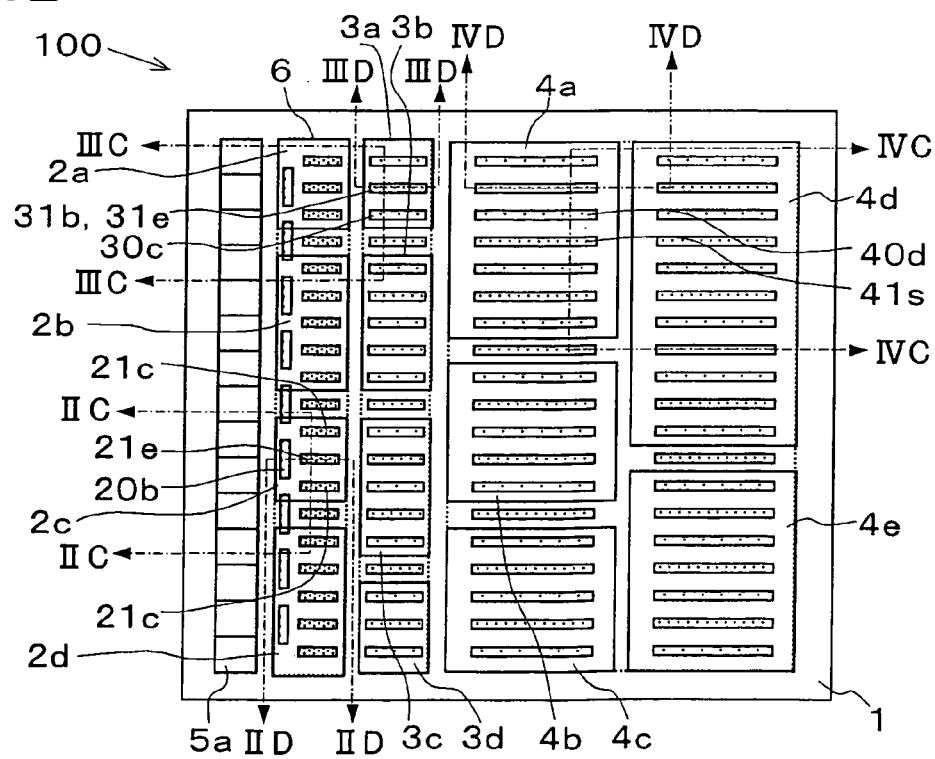
FIG. 1B is a plan view of the semiconductor device after a diffusion structure forming process is completed.
Figure 2A:
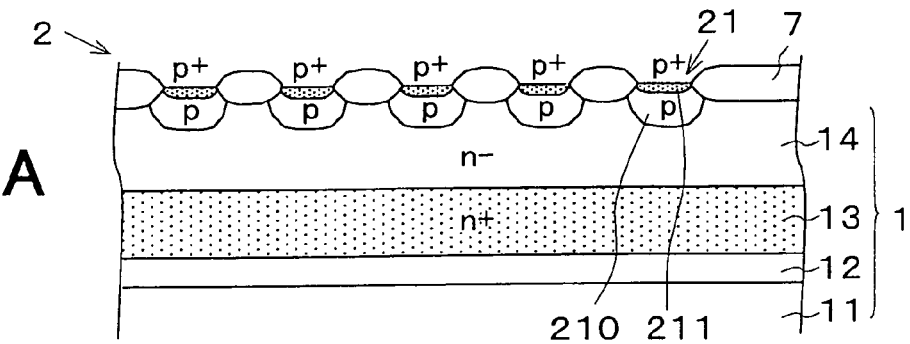
FIG. 2A is a cross-sectional view of the semiconductor device shown in FIG. 1A sectioned by line IIA-IIA.
Figure 2B:
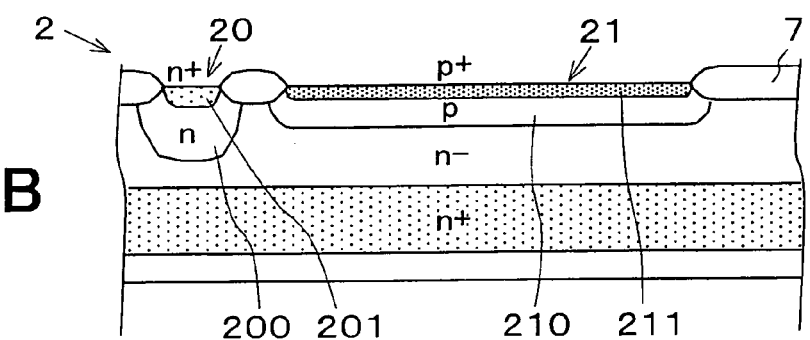
FIG. 2B is a cross-sectional view of the semiconductor device shown in FIG. 1A sectioned by line IIB-IIB.

Referring to FIGS. 1A and 1B, a semiconductor device 100 is formed on a substrate 1, which is a silicon on insulator (SOI) substrate. The substrate 1 includes a silicon (Si) substrate 11, an insulating layer 12, a highly doped N-type diffusion layer 13, and a lightly doped N-type diffusion layer 14, as shown in FIG. 2A. The highly doped N-type diffusion layer 13 and the lightly doped N-type diffusion layer 14 form an SOI layer, the thickness of which is approximately 10 μm.

The substrate 1 has regions, each of which includes the semiconductor components of a kind 2a-2d, 3a-3d, 4a-4e as indicated with dotted lines in FIG. 1A. The regions include bipolar transistor regions 2 and 3, an LDMOS transistor region 4, and a CMOS transistor region 5. The bipolar transistor region 2 has rectangular-shaped diffusion regions 20, 21. The bipolar transistor region 3 has rectangular-shaped diffusion regions 30, 31. The LDMOS transistor region 4 has rectangular-shaped diffusion regions 40, 41. The COMS transistor region 5 also has rectangular-shaped diffusion regions (not shown). The diffusion regions 20, 21, 30, 31, 40, 41 form diffusion structures that contain repeated patterns in the respective regions 2, 3, 4.

The bipolar transistor region 2 is separated into four sections by trenches 6 indicated with solid lines in FIG. 1B. Each section forms a bipolar transistor 2a, 2b, 2c, 2d. The bipolar transistor region 3 is separated into four sections by trenches 6, forming bipolar transistors 3a, 3b, 3c, 3d. The LDMOS transistor region 4 is separated into five sections by trenches 6, forming LDMOS transistors 4a, 4b, 4c, 4d, 4e. The areas outside the trenches 6 in each region 2, 3, 4 are disabled diffusion regions. The transistors (semiconductor components) 2a-2d, 3a-3d, 4a-4e are formed in certain sizes according to required current capacities. The CMOS transistor region 5 is separated into sections, forming CMOS transistors 5a.

The trenches 6 are formed at positions where local oxidation of silicon (LOCOS) 7 is formed with depths that reach the insulating layer 12 of the substrate 1. The trenches 6 have lateral insulating layers in which polysilicon or borophosphosilicate glass (BPSG) is implanted for insulating the semiconductor device.

The semiconductor components 2a-2d, 3a-3c, 4a-4e are formed in the highly doped diffusion layer 13 and the lightly doped diffusion layer 14. Each semiconductor component 2a-2d, 3a-3c, 4a-4e is separated and isolated from its surrounding areas by the trenches 6. In other words, the trenches 6 do not cross PN junctions. Therefore, no leak occurs from the junctions. If a P-type diffusion layer and an N-type diffusion layer are formed on the insulating layer 12, the trenches 6 do cross the PN junctions. Thus, passivation treatment is required on the lateral walls of the trenches 6. The passivation treatment includes a chemical downstream etching (CDE), a sacrificial oxidation, and a hydrogen treatment.

Horizontally connected PNP bipolar transistors 2a-2d are formed in the bipolar transistor region 2. The diffusion regions 21 that include emitter and collector regions arranged in line so that longitudinal sides of each region 21 are next to longitudinal sides of adjacent regions 21. The diffusion regions 20 that include base regions arranged in line next to adjacent short sides of the regions 21 so that short sides of each region 20 are next to short sides of adjacent regions 20. In the PNP bipolar transistor region 2, the diffusion regions 20, 21 have diffusion structures including repeated patterns.

Each diffusion region 21 includes a P-type diffusion region 210 and a highly doped P-type diffusion region 211 as shown in FIG. 2A. Each diffusion region 20 includes an N-type diffusion region 200 and a highly doped N-type diffusion region 201.

Figure 2C:
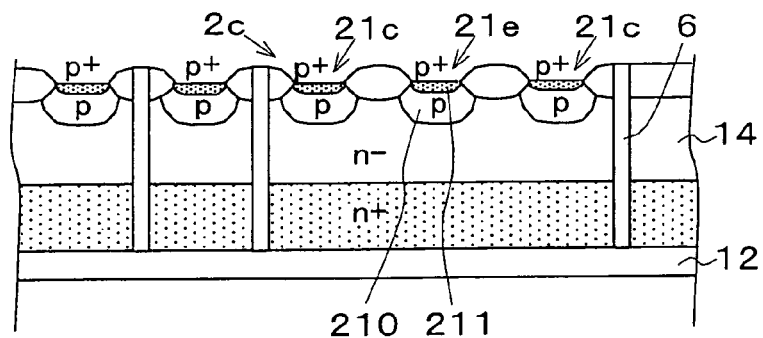
FIG. 2C is a cross-sectional view of the semiconductor device shown in FIG. 1B sectioned with line IIC-IIC.
Figure 2D:
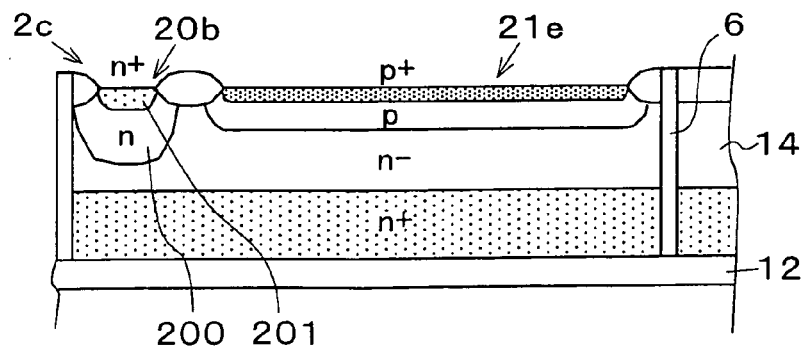
FIG. 2D is a cross-sectional view of the semiconductor device shown in FIG. 1B sectioned with line IID-IID.

When the bipolar transistor region 2 is separated by the trenches 6, the PNP bipolar transistors 2a-2d are formed. Cross-sectional views of the bipolar transistor 2c sectioned by line IIC-IIC and line IID-IID are shown in FIGS. 2C and 2D, respectively, as examples. The P-type diffusion region 210 located in the center and the highly doped P-type diffusion region 211 form an emitter 21e. The P-type diffusion regions 210 on both sides of the center region 210 and the highly doped P-type diffusion region 211 form a collector 21c. The N-type diffusion region 200, the highly doped N-type diffusion region 201, and the lightly doped layer 14 form a base 20b.

Vertically connected NPN bipolar transistors 3a-3d are formed in the bipolar transistor region 3. The diffusion regions 30 that include collector regions and the diffusion regions 31 that include emitter and base regions are alternately arranged in line. Longitudinal sides of each region 30 are next to longitudinal sides of adjacent regions 31. In the NPN bipolar transistor region 3, the diffusion regions 30, 31 have diffusion structures including repeated patterns.

A P-type diffusion region 310 is formed in each diffusion region 31 with the LOCOS 7 as a mask for diffusion. In the P-type diffusion region 310, a highly doped N-type diffusion region 312 is formed in the center. Furthermore, a highly doped P-type diffusion region 311 is formed around and a predetermined distance away from the N-type diffusion region 312. The P-type diffusion region 311 and the N-type diffusion region 312 are formed with photo resist as a diffusion mask. The diffusion region 30 includes highly doped N-type diffusion regions 300, 301. The N-type diffusion region 301 is formed on top of the N-type diffusion region 300.

Figure 3A:
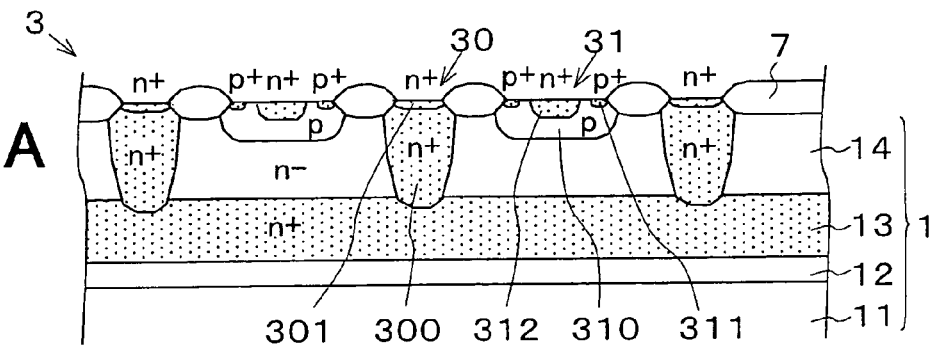
FIG. 3A is a cross-sectional view of the semiconductor device shown in FIG. 1A sectioned with line IIIA-IIIA.
Figure 3B:
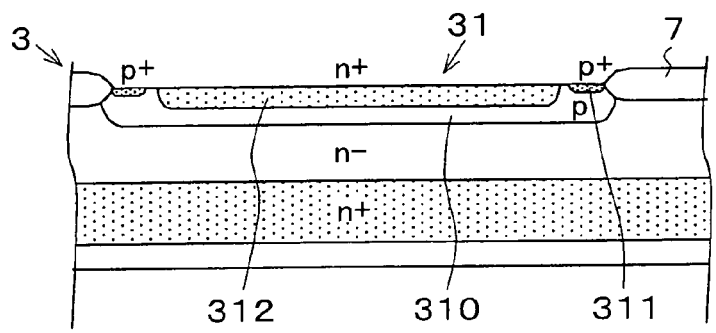
FIG. 3B is a cross-sectional view of the semiconductor device shown in FIG. 1A sectioned with line IIIB-IIIB.
Figure 3C:
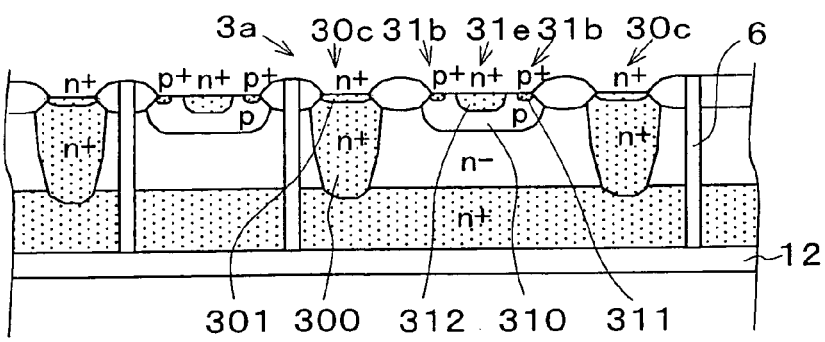
FIG. 3C is a cross-sectional view of the semiconductor device shown in FIG. 1B sectioned with line IIIC-IIIC.
Figure 3D:
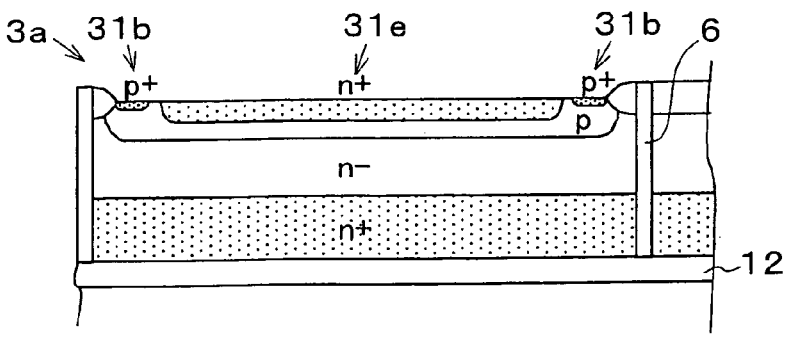
FIG. 3D is a cross-sectional view of the semiconductor device shown in FIG. 1B sectioned with line IIID-IIID.

When the bipolar transistor region 3 is separated by the trenches 6, the NPN bipolar transistors 3a-3d are formed. The NPN bipolar transistor 3a shown in FIGS. 3C and 3d has a base 31b, an emitter 31e, and a collector 31c. The base 31b is formed by the P-type diffusion region 310 and the highly doped P-type diffusion region 311. The emitter 31e is formed by the highly doped N-type diffusion region 312 located in the center. The collector 31c is formed by the highly doped N-type diffusion regions 300, 301 and the highly doped N-type diffusion layer 13 of the substrate 1. The diffusion regions 31 located between the NPN bipolar transistors 3a-3d are left out when the NPN bipolar transistors 3a-3d are formed. As a result, the collector 30c is formed near the trench 6 as shown in FIGS. 3C, 3D.

The diffusion region 40 that forms a drain and the diffusion region 41 that forms a source of the LDMOS transistor are alternately arranged in two rows in the SDMOS transistor region 4. In the LDMOS transistor region 4, the diffusion regions 40, 41 have diffusion structures including alternately repeated patterns.

Figure 4A:
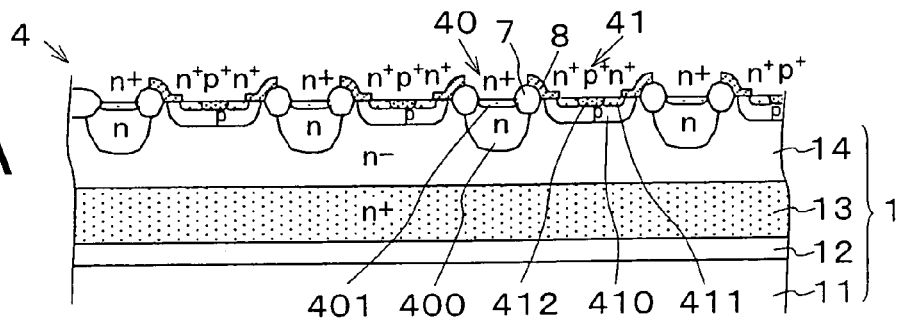
FIG. 4A is a cross-sectional view of the semiconductor device shown in FIG. 1A sectioned with line IVA-IVA.
Figure 4B:
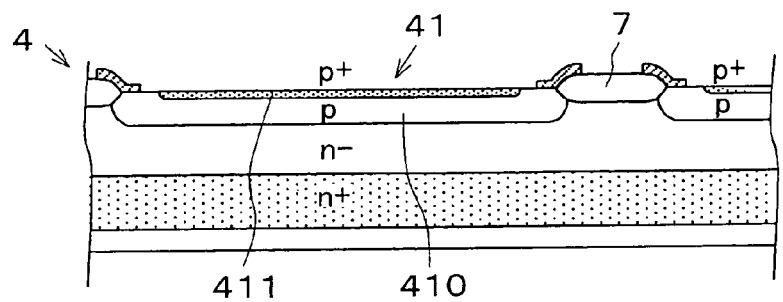
FIG. 4B is a cross-sectional view of the semiconductor device shown in FIG. 1A sectioned with line IVB-IVB.

Each diffusion region 40 has an N-type diffusion region 400 and a highly doped N-type diffusion region 401 as shown in FIG. 4A. Each diffusion region 41 has a P-type diffusion region 410, highly doped N-type diffusion regions 411, and a highly doped P-type diffusion region 412. The highly doped P-type diffusion region 412 is formed in the center of the P-type diffusion region 410. The highly doped N-type diffusion regions 411 are formed on both sides of the highly doped P-type diffusion region 411. The highly doped N-type diffusion region 411, which forms a source, is formed using a gate electrode 8 as a mask for diffusion from the gate electrode 8 to the diffusion region 40.

When the LDMOS transistor region 4 is separated by the trenches 6, the LDMOS transistors 4a-4e are formed. The LDMOS transistor 4a has a channel, a source 41s, and a drain 40d. The channel is formed by the P-type diffusion region 410. The source 41s is formed by the highly doped N-type diffusion region 411. The drain 40d is formed by the N-type diffusion region 400 and the highly doped region 401.

Figure 4C:
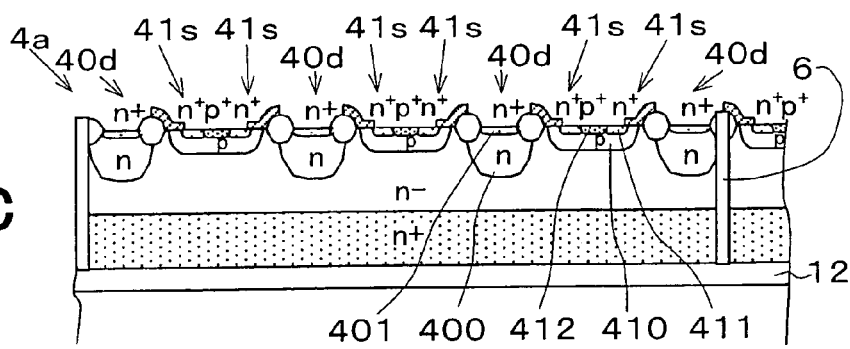
FIG. 4C is a cross-sectional view of the semiconductor device shown in FIG. 1B sectioned with line IVC-IVC.
Figure 4D:
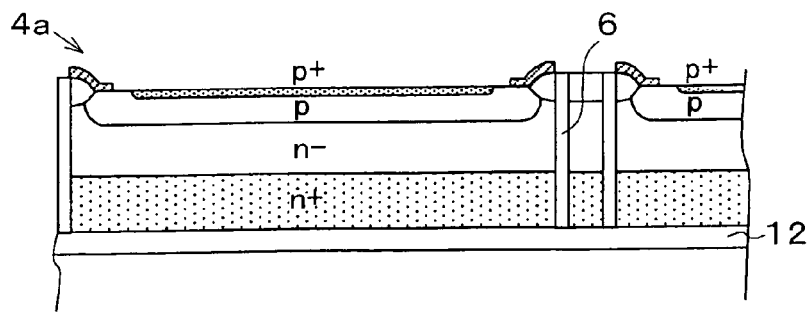
FIG. 4D is a cross-sectional view of the semiconductor device shown in FIG. 1B sectioned with line IVD-IVD.
Figure 5A:
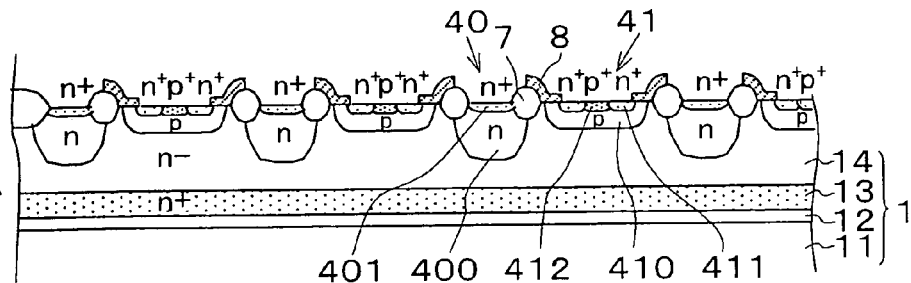
FIG. 5A is a cross-sectional view of the semiconductor device shown in FIG. 1A sectioned with line IVA-IVA.
Figure 5B:
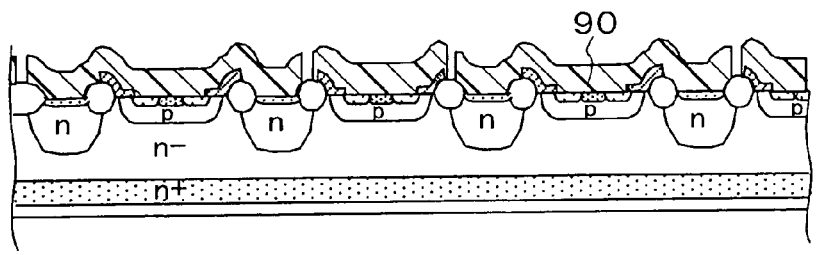
FIG. 5B is a cross-sectional view of the semiconductor device shown in FIG. 1A sectioned with line IVA-IVA.
Figure 5C:
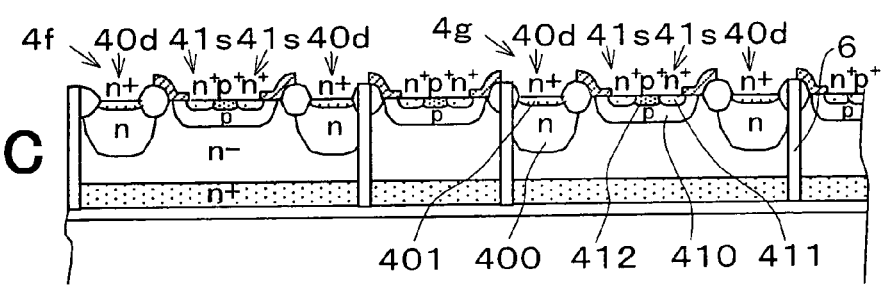
FIG. 5C is a cross-sectional view of the semiconductor device shown in FIG. 1A sectioned with line IVA-IVA.
Figure 5D:
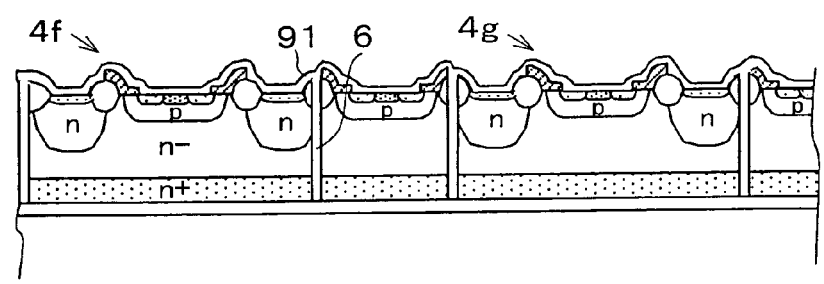
FIG. 5D is a cross-sectional view of the semiconductor device shown in FIG. 1A sectioned with line IVA-IVA.
Figure 5E:
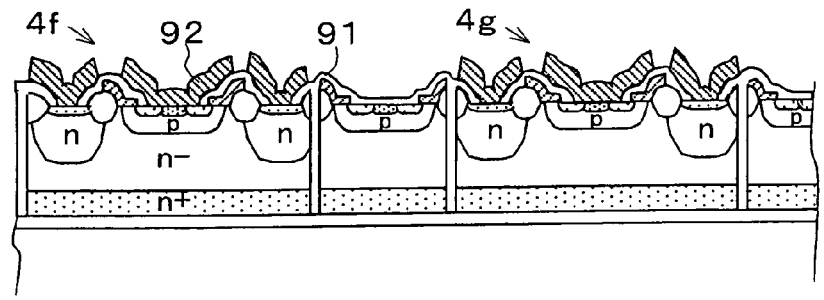
FIG. 5E is a cross-sectional view of the semiconductor device shown in FIG. 1A sectioned with line IVA-IVA.

The diffusion regions 41 located between the LDMOS transistors 4a-4e are left out when the LDMOS transistors 4a-4e are formed. As a result, the drain 40d is formed near the trench 6 as shown in FIGS. 4C, 4D. The COMS transistors are formed in the CMOS transistor region 5 in the same manner as the LDMOS transistors 4a-4e.

Each semiconductor component 2a-2d, 3a-3d, 4a-4e is tested in different sizes for obtaining optimum characteristics or responding various performance requirement. Therefore, it is preferable that the semiconductor component 2a-2d, 3a-3d, 4a-4e is easily sized.

In each area 2, 3, 4 of the semiconductor device 100 can be separated into different sizes of the semiconductor components in the same kind using a diffusion structure having a repeated pattern. For example, different sizes of bipolar transistors 3a-3d can be formed in the bipolar transistor region 3. The sizes of the bipolar transistors 3a-3d can be easily defined using the repeated pattern as a unit. The sizes of transistors 2a-2d, 3a-3d, 4a-4e can be even more easily defined by forming the diffusion regions 20, 21, 30, 31, 40, 41 in rectangular. The sizes of the transistors 2a-2d, 3a-3d, 4a-4e determine the current capacity. Therefore, the semiconductor device 100 can be easily designed.

Sizing the semiconductor components is especially useful if they are analog components for processing analog signals such as a bipolar transistor, or power components for controlling power supply such as an LDMOS transistor. If the semiconductor device 100 is constructed only from digital components, an electronic circuit can be easily modified by adding digital components as required. For example, gate arrays constructed of certain sizes of CMOS transistors arranged on a semiconductor substrate that is a platform can be modified by adding CMOS transistors. However, the sizes of the analog components and the power components have to be modified in each circuit application since the current capacity differs from a component to a component.

In the semiconductor device 100, the transistors 2a-2d, 3a-3d, 4a-4e are formed by separating respective regions 2, 3, 4 with trenches 6 using the substrate 1 as a platform. As a result, the certain sizes of the components, that is, certain current capacity, are defined even when the components are analog or power components.

Sizing semiconductor components is also useful for a hybrid IC in which a digital component 5a, analog components 2a-2d, 3a-3d, power components 4a-4e are integrated in a single chip. In the semiconductor device 100, certain sizes of semiconductor components are easily formed in each region 2, 3, 4, 5 using the substrate 1. Thus, a testing period of the semiconductor device 100 can be greatly reduced and a development cost related to man-hour.

The semiconductor components of a kind are included in the same region 2, 3, 4, 5. Therefore, various types of semiconductor devices can be manufactured by modifying the substrate 1 prepared in several configurations as standard platforms. By preparing the substrate 1 as a platform, the manufacturing cost can be reduced.

A method for manufacturing the semiconductor device 100 will be explained. The SOI substrate 1, the diffusion regions 20, 21, 30, 31, 40, 41, the LOCOS 7, and the gate electrode 8 are formed by known methods.

Referring to FIGS. 5A to 5E, a trench forming process will be explained. The SOI substrate 1 includes diffusion regions 40 and 41. The diffusion region 40 contains an N-type diffusion region 400 and a highly doped N-type diffusion region 401. The diffusion region 41 contains a P-type diffusion region 410, a highly doped N-type diffusion region 411, and a highly doped P-type diffusion region 412.

The SOI substrate 1 on which the diffusion regions 40, 41, the LOCOS 7, and the gate electrode 8 are formed is covered with a resist 90. Openings are created at positions that the trenches 6 are formed by photolithography.

The resist 90 with the openings is used as a mask and the trenches 6 are formed with depths that reach the insulating layer 12 by etching. Then, the resist 90 is removed. As a result, LDMOS transistors 4f, 4g are formed, and the diffusion regions 40 and 41 are defined as a drain 40d and a source 41s, respectively. Passivation, such as CDE, is performed to the side walls of the trenches 6 and oxide films with thickness up to 50 nm are formed on the walls by low-temperature oxidation.

Borophosphosilicate glass (BPSG) 91 is deposited on an entire surface of the SOI substrate 1 to fill in the trenches 6. Heat treatment is performed at around 930° C. for a BPSG reflow. The BPSG 91 is leveled and the trenches 6 are solidly filled in. By the heat treatment, the diffusion regions 2, 3, 4 formed on the SOI substrate 1 are activated.

Contact holes are created in the BPSG 91 and first-layer aluminum (Al) patterns 92 are formed. As a result, the LDMOS transistors 4f, 4g are formed. Second-layer metallization patterns are formed on top of the first-layer Al patterns 92 and a passivation film is formed on top of the second-layer patterns.

In this method, the diffusion structures having the repeated patterns are formed by the diffusion process, and then, the trenches 6 are formed. Each semiconductor component 4f, 4g are separated and isolated from surrounding areas. Finally, the patterns 92 are connected.

The semiconductor components 4f, 4g are separated by mechanically creating narrow trenches, which is different from electrical separation using diffusion, such as PN junction separation. Therefore, the separating step can be performed after the diffusion step. In this method, the diffusion structures are prepared as platforms, and the formation of the trenches 6 is performed after the diffusion step. As a result, the testing period of the semiconductor device 100 is reduced, and the development cost and the manufacturing cost are lowered.

The BPSG 91 used for filling in the trenches 6 form an interlayer dielectric for the patterns 92. This shortens the manufacturing process and reduces the manufacturing cost.

The SOI substrate may include only one layer N-type diffusion layer or P-type diffusion layer. A silicon oxide film ($SiO_2$) may be used for the etching mask for the trench formation. Sacrificial oxidation or hydrogen treatment may be performed to the side walls of the trenches 6 for passivation.

If no current leakage is expected, the passivation is not required. Thicker oxide film may be formed on the side walls by high-temperature oxidation.

The trenches 6 may be filled in with polysilicon. In this case, a thin oxide film may be formed on the entire region by CVD, the polysilicon is deposited to fill in the trenches 6, and extra polysilicon is etched back using the oxide film as a stopper. When the highly doped N-type diffusion layer 13 and the lightly doped N-type diffusion layer 14 are thicker than the lower portions of the substrate 1, the trenches 6 are not solidly filled in with the BPSG 91. In such a case, polysilicon effectively fills in the trenches 6.

SECOND EMBODIMENT

Figure 6A:
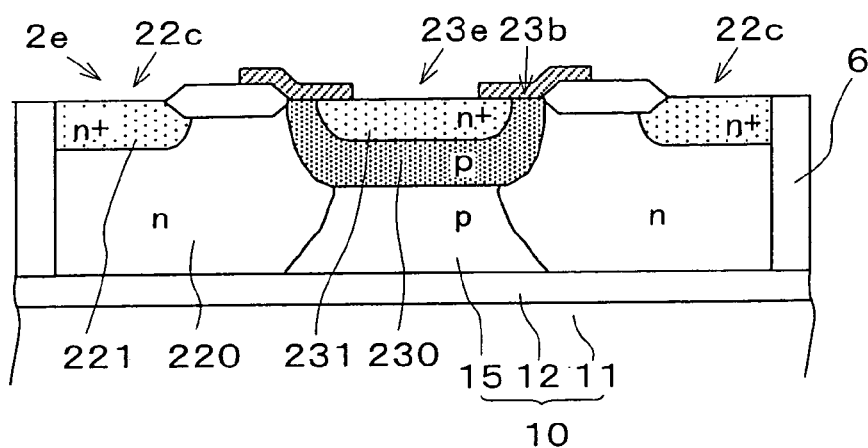
FIG. 6A is a cross-sectional view of a horizontally connected NPN bipolar transistor formed according to the second embodiment of the present invention.
Figure 6B:
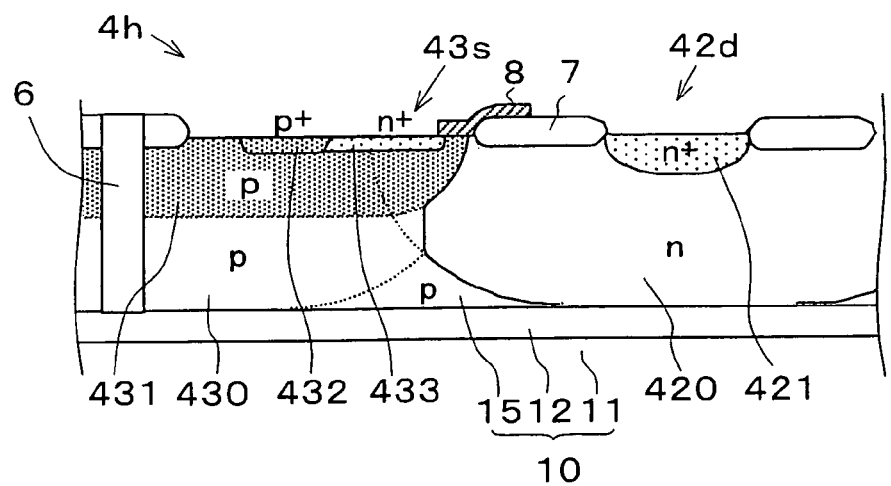
FIG. 6B is a cross-sectional view of an LDMOS transistor according to the second embodiment.

Referring to FIG. 6A, a horizontally connected NPN bipolar transistor 2e includes a P-type diffusion region 230, a highly doped N-type diffusion region 231, an N-type diffusion region 220, and a highly doped N-type diffusion region 221. The P-type diffusion region 230 forms a base 23b. The highly doped N-type diffusion region 231 forms an emitter 23e. The N-type diffusion region 220 and the highly doped N-type diffusion region 221 form a collector 22c.

It is preferable that the diffusion regions 230 and 231 are formed using a double diffusion method taking an end of polysilicon or LOCOS formed via an oxide film as an origin for a self-aligned process. In this case, the width of the base 23b is precisely controlled, which provides good response and flat current gain. Therefore, stable bipolar transistors can be provided. The diffusion regions 230, 231 and the diffusion regions 220, 221 are formed in rectangular and arranged in line so that their longitudinal sides are next to each other. The NPN bipolar transistor 2e is formed by separating the region 2 by the trenches 6.

The LDMOS transistor 4h includes a highly doped N-type diffusion region 421, P-type diffusion regions 431, 432, and a highly doped N-type diffusion region 433. The highly doped N-type diffusion region 421 is formed in an N-type well 420 to form a drain 42d. The P-type diffusion regions 431, 432 are formed in a P-type well and serve as channels. The highly doped N-type diffusion region 433 forms a source 43s. The diffusion regions 420, 421 and the diffusion regions 430, 431, 432, 433 are formed in rectangular and arranged in line so that their longitudinal sides face to each other. The LDMOS transistor 4h is formed by separating by the trenches 6.

The methods for manufacturing the NPN bipolar transistor 2e and the LDMOS transistor 4h are same as the methods discussed in the first embodiment. However, the semiconductor components 2e, 4h are formed on the SOI layer constructed of a thin P-type diffusion layer 15 with the thickness of about 5 μm. Therefore, the trenches 6 are easily filled in with BPSG and the manufacturing cost is lower than using polysilicon for filling in the trenches 6.

THIRD EMBODIMENT

Figure 7:
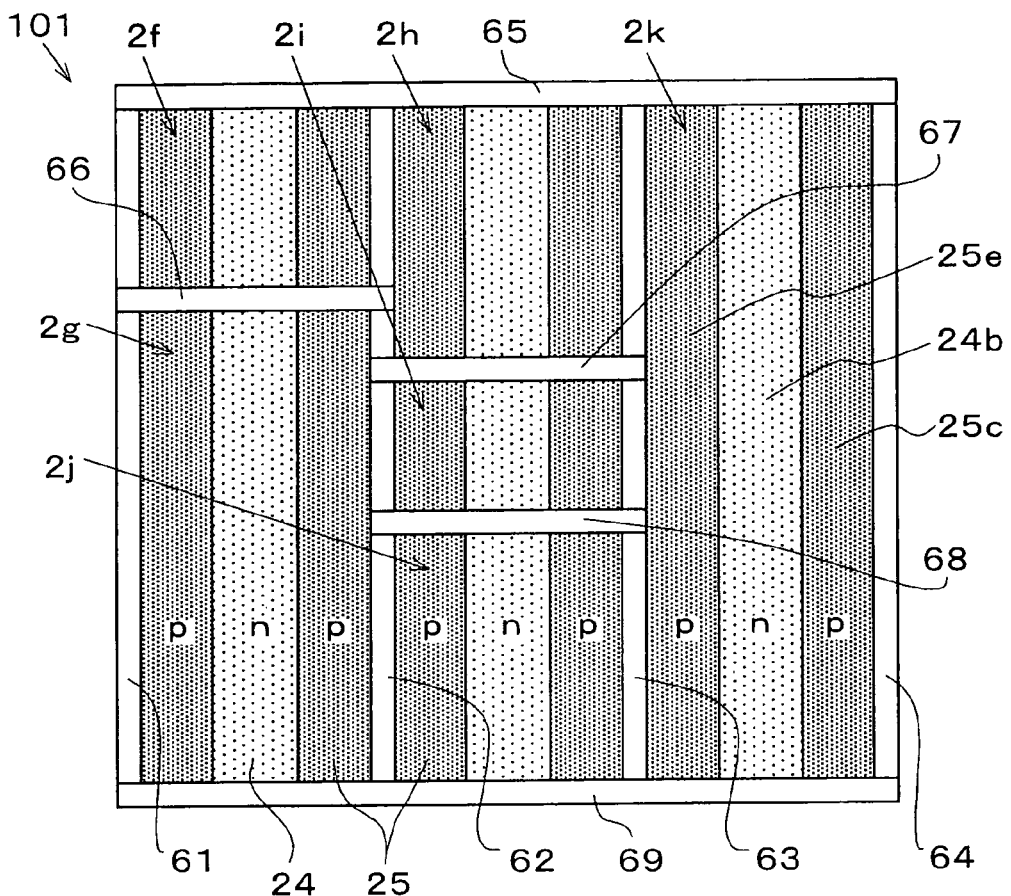
FIG. 7 is a plan view of a semiconductor device according to the third embodiment of the present invention.

Referring to FIG. 7, a semiconductor device 101 includes horizontally connected PNP bipolar transistors 2f-2k. The device 101 has diffusion structures in which rectangular-shaped N-type diffusion region 24 and P-type diffusion region 25 are arranged in repeated patterns. The PNP bipolar transistors 2f-2k are formed by separating the regions 24 and 25 into sections by trenches 61-69. Each PNP bipolar transistor 2f-2k is separated by trenches 62 and 63 formed parallel to the longitudinal sides of the transistor 2f-2k, and trenches 66-68 formed crossing the repeated patterns.

In the PNP bipolar transistor 2k, the P-type diffusion region 25e, the N-type diffusion region 25b, and the P-type diffusion region 25c form an emitter, a base, and a collector, respectively. In the diffusion structures, the trenches 66, 67, 68 are formed crossing the repeated patterns to define the semiconductor components 2f, 2g, 2h, 2i, 2j. The sizes of the semiconductor components 2f-2j are easily defined. Therefore, the semiconductor device 101 can be easily designed.

FOURTH EMBODIMENT

Figure 8:
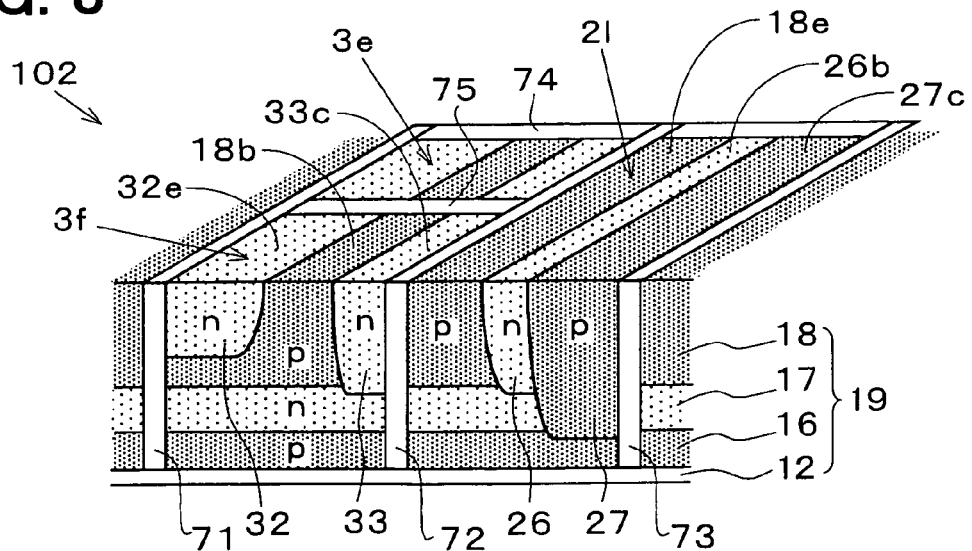
FIG. 8 is a perspective partial view of a semiconductor device according to the fourth embodiment of the present invention.

Referring to FIG. 8, a semiconductor device 102 includes vertically connected NPN bipolar transistors 3e, 3f and a horizontally connected PNP bipolar transistor 21. A SOI substrate 19 that includes a P-type diffusion layer 16, an N-type diffusion layer 17, a P-type diffusion layer laminated on an insulating layer 12 is used in the semiconductor device 102.

NPN bipolar transistor regions of the semiconductor device 102 have diffusion structures including two N-type diffusion regions 32, 33. The PNP bipolar transistor region 21 has diffusion structures including an N-type diffusion region 26 and a P-type diffusion region 27. The NPN bipolar transistors 3e, 3f and the PNP bipolar transistor 21 are separated by a trench 72 between the longitudinal sides of the N-type diffusion regions and the bipolar transistor region 21. The NPN bipolar transistors 3e, 3f are separated by a trench 75 crossing the N-type diffusion regions 32, 33.

In the NPN bipolar transistor 3f, the N-type diffusion region 32, the P-type diffusion layer of a substrate 18, and the N-type diffusion region 33 form an emitter 32e, a base 18b, and a collector 33c, respectively. In the PNP transistor, the P-type diffusion layer 18, the N-type diffusion region 26, and the P-type diffusion area 27 form an emitter 18e, a base 26b, and a collector 27c, respectively.

In the diffusion structures, the semiconductor components 3e, 3f, 21 are defined by forming trenches 72, 75 next to the end of or crossing the diffusion areas. As a result, the sizes of the semiconductor components are easily defined and the semiconductor device is easily designed.

FIFTH EMBODIMENT

Figure 9A:
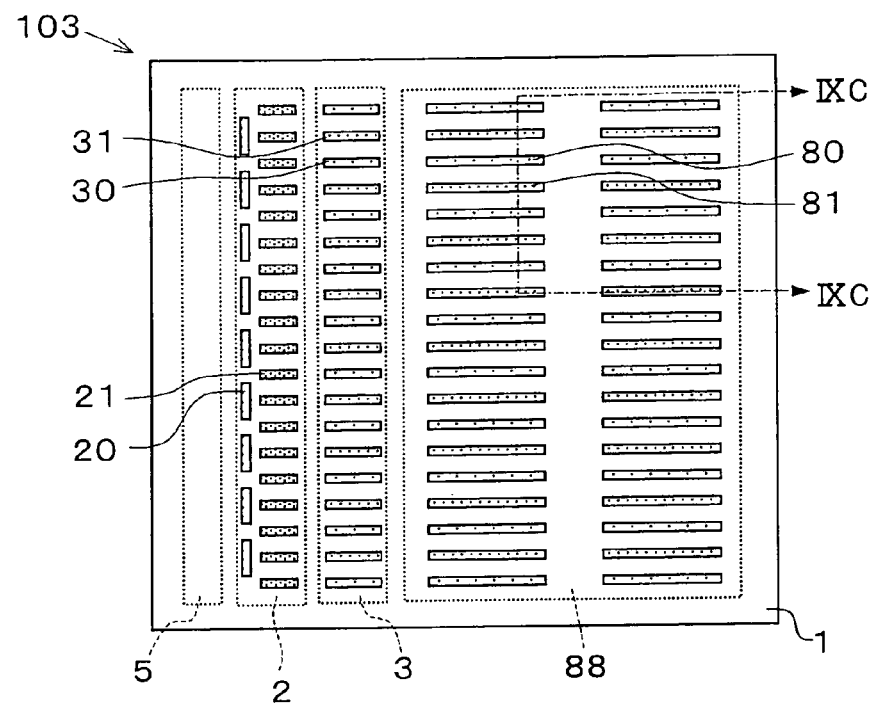
FIG. 9A is a plan view of a semiconductor device according to the fifth embodiment of the present invention.
Figure 9B:
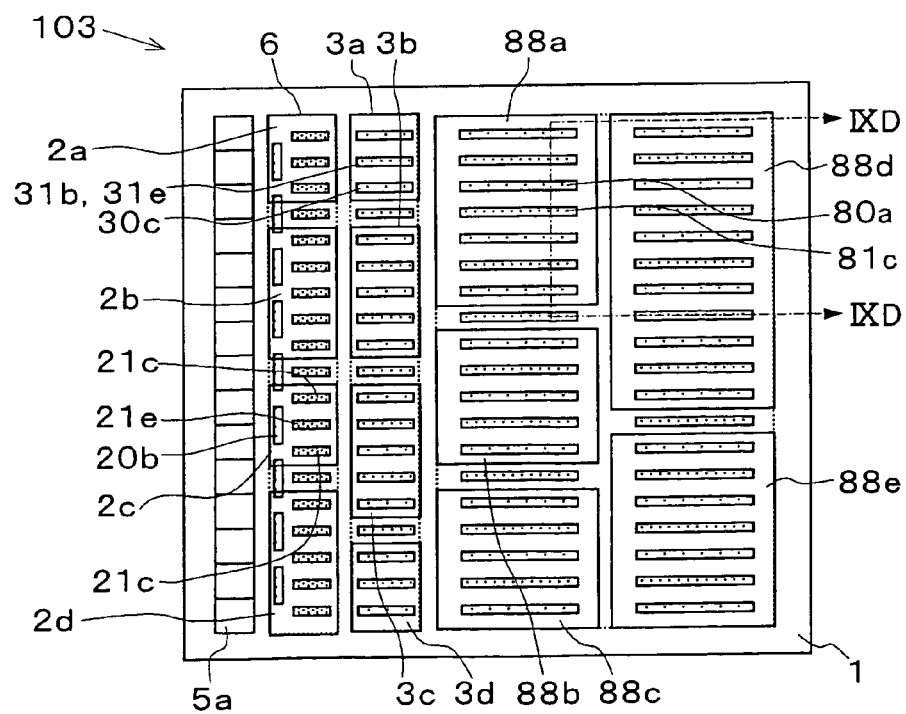
FIG. 9B is a plan view of the semiconductor device after a diffusion structure forming process is completed.
Figure 9C:
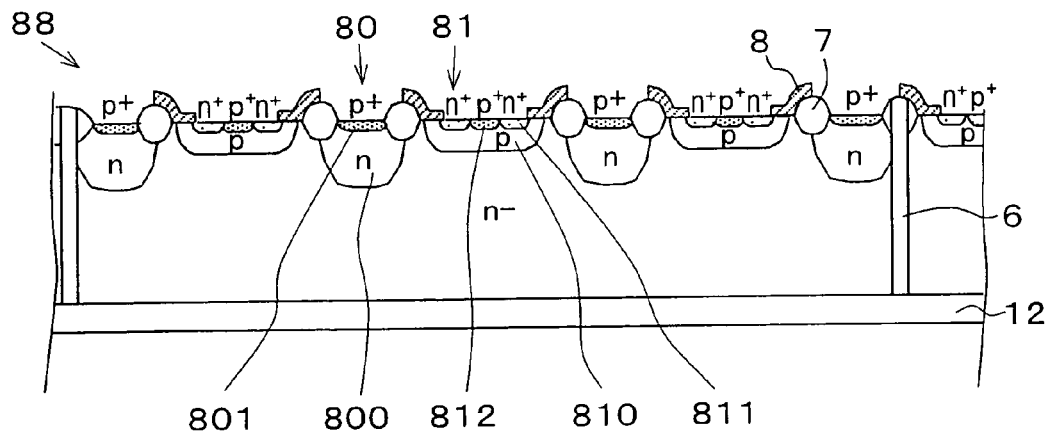
FIG. 9C is a cross-sectional view of the semiconductor device shown in FIG. 9A sectioned by line IXC-IXC.

Referring to FIGS. 9A and 9B, a semiconductor device 103 has a lateral insulated gate bipolar transistor (LIGBT) region 88. The rest of the structure of the device 103 is the same as the semiconductor device 100 shown in FIGS. 1A and 1B except for the highly doped N-type diffusion layer 13. The LIGBT region includes rectangular diffusion regions 80, 81 alternately formed in two lines in the manner that the longitudinal sides of the regions 80, 81 are next to each other. The diffusion regions 80, 81 form a cathode and an anode, respectively. The LIGBT region 88 has diffusion structures including repeated patterns in which the diffusion regions 80, 81 are alternately formed.

The diffusion region 80 includes an N-type diffusion region 800 and a highly doped P-type diffusion region 801. The diffusion region 81 includes a P-type diffusion region 810, highly doped N-type diffusion regions 811, and a highly doped P-type diffusion region 812. The highly doped P-type diffusion region 812 is formed in the center of the P-type diffusion region 810. The highly doped N-type diffusion regions 812 are formed both sides of the diffusion region 811. The highly doped N-type diffusion region 811 is diffused from the gate electrodes 8 toward the diffusion region 80 using gate electrodes 8 as a mask. The gate electrodes 8 extend over a part of the LOCOS 7.

Figure 9D:
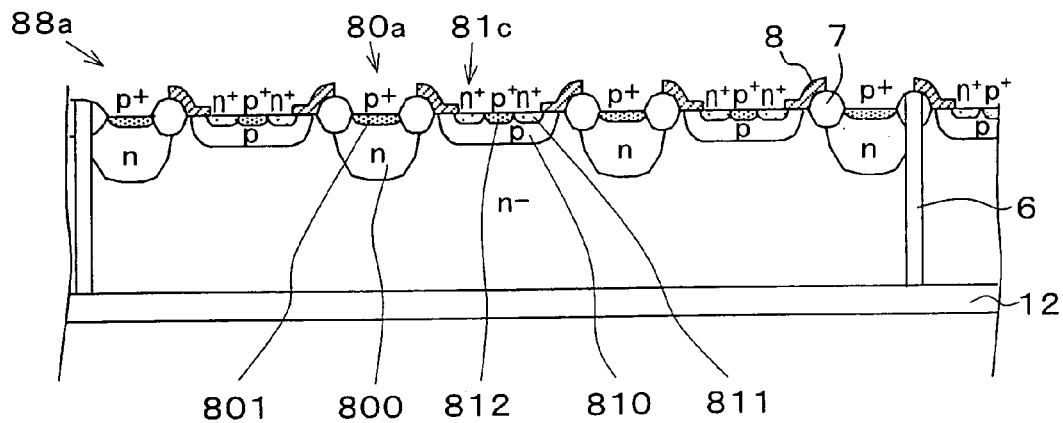
FIG. 9D is a cross-sectional view of the semiconductor device shown in FIG. 9B sectioned by line IXD-IXD.

The semiconductor component 88*a* that is separated by a trench 6 as shown in FIG. 9B forms an LIGBT shown in FIG. 9D. The P-type diffusion region 810 forms a channel in the LIGBT 88*a*. The highly doped N-type diffusion region 811 forms a cathode 81*c*. The N-type diffusion region 800 and the highly doped P-type diffusion region 801 form an anode 80*a*.

SIXTH EMBODIMENT

Figure 10:
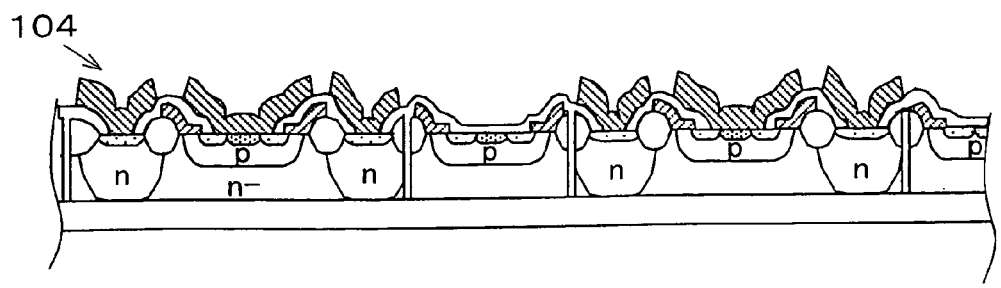
FIG. 10 is a cross-sectional view of a semiconductor device according to the sixth embodiment of the present invention.

Referring to FIG. 10, a semiconductor device 104 includes an SOI substrate having the thickness of SOI approximately 1.5.m. Since the thickness of SOI is very thin, the trenches 6 are easily filled in. In other words, the trenches 6 are filled in by applying BPSG depositing process and reflow processes for filling in process of the BPSG becomes simpler.

The present invention should not be limited to the embodiment previously discussed and shown in the figures, but may be implemented in various ways without departing from the spirit of the invention. The present invention may be applied to CMOS and LDMOS transistors. Gate width of the CMOS or the LDMOS transistor can be easily set by forming a trench crossing diffusion regions that form a source and a drain.

What is claimed is:

1. A semiconductor device comprising:
    a semiconductor substrate; and
    a standard platform formed in the semiconductor substrate, the standard platform comprising a plurality of repeated patterns of diffusion regions common to a same kind of semiconductor components, the plurality of repeated patterns of the diffusion regions being separated by trenches to form a plurality of prescribed different sizes of the same kind of semiconductor components,
    wherein the same kind of semiconductor components have the same operational mode.

2. The semiconductor device according to claim 1, wherein the semiconductor substrate is a silicon on insulator substrate.

3. The semiconductor device according to claim 2, wherein:
    the silicon on insulator substrate includes an insulating layer and a semiconductor layer;
    the semiconductor layer is formed on the insulating layer; and
    the semiconductor layer has a thickness equal to or less than five micrometers.

4. The semiconductor device according to claim 1, wherein the trench is filled in with borophosphosilicate glass.

5. The semiconductor device according to claim 1, wherein each of the-plurality of repeated patterns of diffusion regions has a rectangular shape.

6. The semiconductor device according to claim 1, wherein the semiconductor component is an analog component for processing an analog signal.

7. The semiconductor device according to claim 6, wherein the analog component is a bipolar transistor.

8. The semiconductor device according to claim 1, wherein the semiconductor device is a power component for controlling power supply.

9. The semiconductor device according to claim 8, wherein the power component is a laterally diffused metal oxide semiconductor transistor.

10. The semiconductor device according to claim 8, wherein the power component is an insulated gate bipolar transistor.

11. The semiconductor device according to claim 1, wherein the semiconductor device is a hybrid-IC in which different kinds of semiconductors are integrated in a single chip.

12. The semiconductor device according to claim 1, wherein the standard platform further includes another plurality of repeated patterns of diffusion regions common to another kind of semiconductor components and separated by trenches to form prescribed sizes of the another kind of semiconductor components.

13. A semiconductor device comprising:
    a semiconductor substrate; and
    a plurality of semiconductor component regions formed in the semiconductor substrate, each of the plurality of semiconductor component regions comprising a plurality of repeated patterns of diffusion regions; and
    one or more trenches separating the plurality of semiconductor component regions,
    wherein at least some of the plurality of semiconductor component regions are of different sizes,
    wherein at least some of the plurality of semiconductor component regions contain different numbers of the repeated patterns of diffusion regions,
    wherein each of the plurality of semiconductor component regions contains the same kind of semiconductor components, and
    wherein the same kind of semiconductor components have the same operational mode.

14. The semiconductor device according to claim 13, wherein the semiconductor substrate is a silicon on insulator substrate.

15. The semiconductor device according to claim 14, wherein:
    the silicon on insulator substrate includes an insulating layer and a semiconductor layer;
    the semiconductor layer is formed on the insulating layer; and
    the semiconductor layer has a thickness equal to or less than five micrometers.

16. The semiconductor device according to claim 13, wherein each of the-plurality of repeated patterns of diffusion regions has a rectangular shape.

17. The semiconductor device according to claim 13, wherein the semiconductor device is a hybrid-IC in which different kinds of semiconductors are integrated in a single chip.

18. The semiconductor device according to claim 13, wherein each of the plurality of repeated patterns of diffusion regions is associated with the same type of semiconductor device.

19. The semiconductor device according to claim 13, wherein each of the plurality of semiconductor component regions is surrounded on all sides by the one or more trenches.

20. The semiconductor device according to claim 1, wherein each of the plurality of repeated patterns of the diffusion regions is surrounded on all sides by the trenches.

* * * * *